(12) United States Patent
Kawashiro

(10) Patent No.: US 12,463,117 B2
(45) Date of Patent: Nov. 4, 2025

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Fumiyoshi Kawashiro, Chiyoda Tokyo (JP)

(73) Assignees: Kabushiki Kaisha Toshiba, Kawasaki (JP); Toshiba Electronic Devices & Storage Corporation, Kawasaki (JP)

(*) Notice: Subject to any disclaimer, the term of this patent is extended or adjusted under 35 U.S.C. 154(b) by 574 days.

(21) Appl. No.: 17/940,519

(22) Filed: Sep. 8, 2022

(65) Prior Publication Data
US 2023/0298976 A1 Sep. 21, 2023

(30) Foreign Application Priority Data
Mar. 19, 2022 (JP) ................................. 2022-044756

(51) Int. Cl.
*H01L 23/495* (2006.01)
*H01L 23/00* (2006.01)

(52) U.S. Cl.
CPC .. *H01L 23/49513* (2013.01); *H01L 23/49534* (2013.01); *H01L 24/48* (2013.01); *H01L 2224/32245* (2013.01); *H01L 2224/48091* (2013.01)

(58) Field of Classification Search
CPC ............... H01L 24/48; H01L 23/45934; H01L 23/49524; H01L 23/49513; H01L 23/49562; H01L 2224/48091; H01L 2224/32245
See application file for complete search history.

(56) References Cited

U.S. PATENT DOCUMENTS

| | | | |
|---|---|---|---|
| 2002/0033541 A1* | 3/2002 | Uchida | H01L 24/97 257/784 |
| 2004/0056362 A1* | 3/2004 | Moriguchi | H01L 24/40 257/784 |
| 2007/0273009 A1 | 11/2007 | Hauenstein | |
| 2013/0092948 A1 | 4/2013 | Otsuka | |
| 2013/0221514 A1 | 8/2013 | Otsuka et al. | |
| 2015/0069592 A1* | 3/2015 | Tamura | H01L 24/41 257/676 |

(Continued)

FOREIGN PATENT DOCUMENTS

| | | |
|---|---|---|
| EP | 1028520 A1 | 8/2000 |
| JP | H05-072135 U | 9/1993 |

(Continued)

*Primary Examiner* — Vongsavah Sengdara
(74) *Attorney, Agent, or Firm* — Kim & Stewart LLP

(57) ABSTRACT

A semiconductor of an embodiment includes a lead frame including a first bed; a first post; a second post; a semiconductor chip provided on the first upper surface; a first bonding material provided between the first upper surface and the semiconductor chip, the first bonding material joining the first upper surface and the semiconductor chip, a first film thickness of the first bonding material portion being thinner than a second film thickness of the second bonding material portion; a first connector; a second bonding material; and a third bonding material.

10 Claims, 9 Drawing Sheets

(56) References Cited

U.S. PATENT DOCUMENTS

| | | |
|---|---|---|
| 2015/0214139 A1 | 7/2015 | Miyakawa |
| 2015/0221580 A1* | 8/2015 | Fukui ................ H01L 23/49513 |
| | | 257/676 |
| 2015/0221581 A1* | 8/2015 | Tamura ............. H01L 23/49548 |
| | | 257/676 |
| 2015/0221582 A1* | 8/2015 | Miyakawa .............. H01L 24/83 |
| | | 257/676 |
| 2015/0262917 A1* | 9/2015 | Fukui ................ H01L 23/49524 |
| | | 257/676 |
| 2016/0322531 A1* | 11/2016 | Koseki ............. H01L 23/49537 |
| 2017/0060484 A1* | 3/2017 | Kodera ................. G11C 7/1063 |
| 2019/0051577 A1 | 2/2019 | Morinaga et al. |
| 2019/0279943 A1 | 9/2019 | Soda et al. |
| 2019/0295901 A1* | 9/2019 | Motonaga ......... H01L 23/49524 |
| 2020/0105648 A1 | 4/2020 | Prajuckamol et al. |
| 2020/0168575 A1* | 5/2020 | Bemmerl ............... H01L 24/83 |
| 2022/0278018 A1* | 9/2022 | Sato .................... H01L 23/3735 |

FOREIGN PATENT DOCUMENTS

| | | |
|---|---|---|
| JP | H07-153889 A | 6/1995 |
| JP | 2002100716 A | 4/2002 |
| JP | 2008294390 A | 12/2008 |
| JP | 2009130201 A | 6/2009 |
| JP | 5290963 B2 | 9/2013 |
| JP | 2014032985 A | 2/2014 |
| JP | 2015012065 A | 1/2015 |
| JP | 2015142072 A | 8/2015 |
| JP | 2016111259 A | 6/2016 |
| JP | 5977987 B2 | 8/2016 |
| JP | 6006966 B2 | 10/2016 |
| JP | 2019087613 A | 6/2019 |
| JP | 2021158180 A | 10/2021 |
| WO | 98010508 A1 | 3/1998 |
| WO | 2018025571 A1 | 2/2018 |
| WO | 2018150553 A1 | 8/2018 |

* cited by examiner

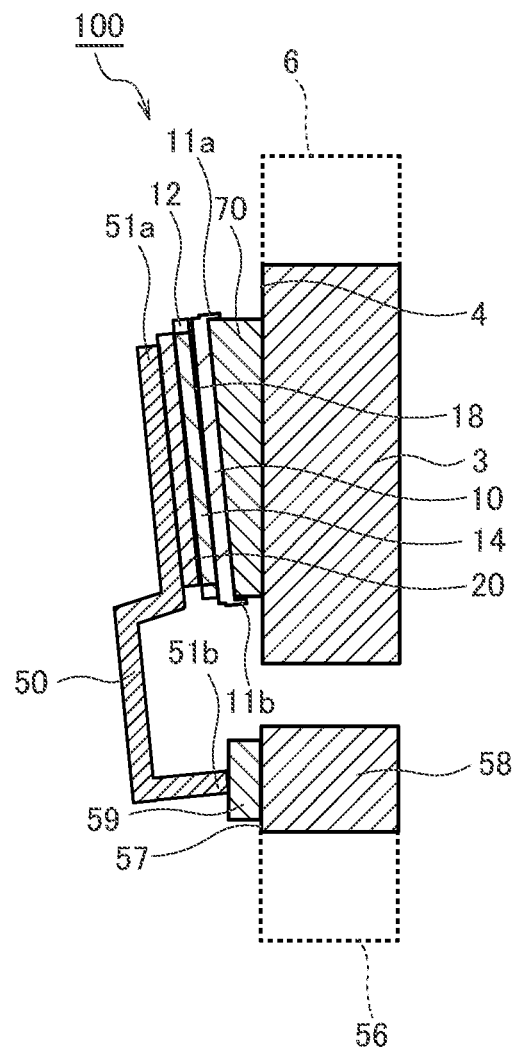
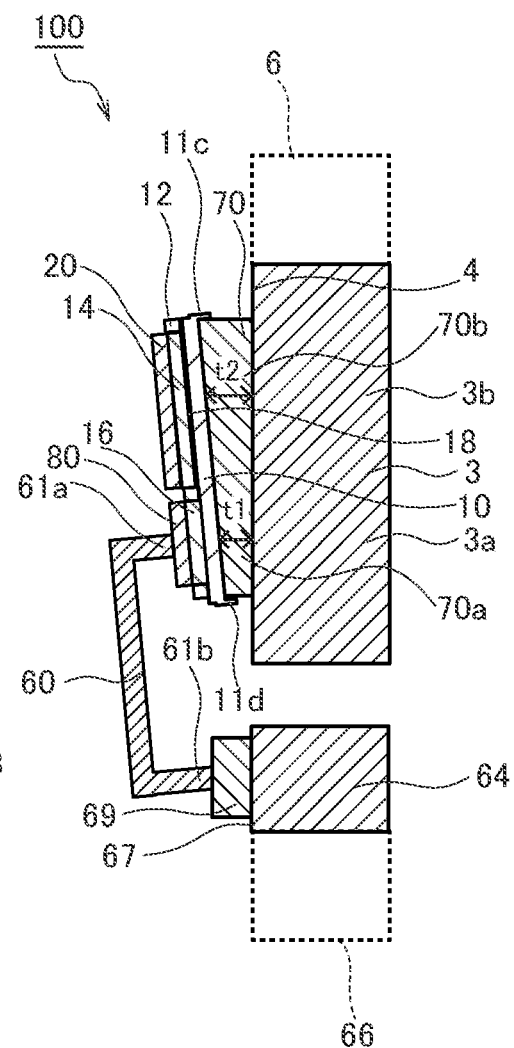
Fig. 2A A-A'
Fig. 2B B-B'

A-A'

A-A'

B-B'

Fig. 5A
A-A'
Fig. 5B
A-A'
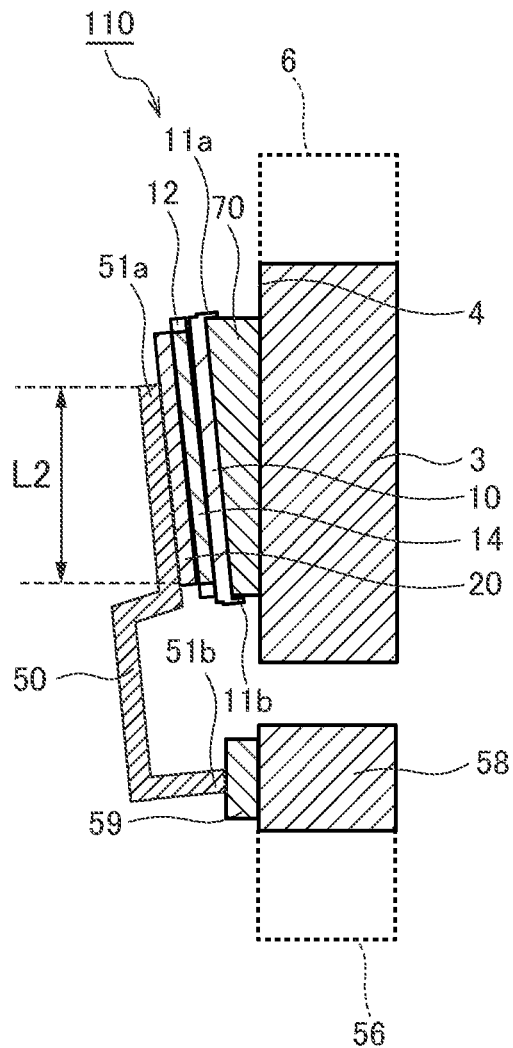
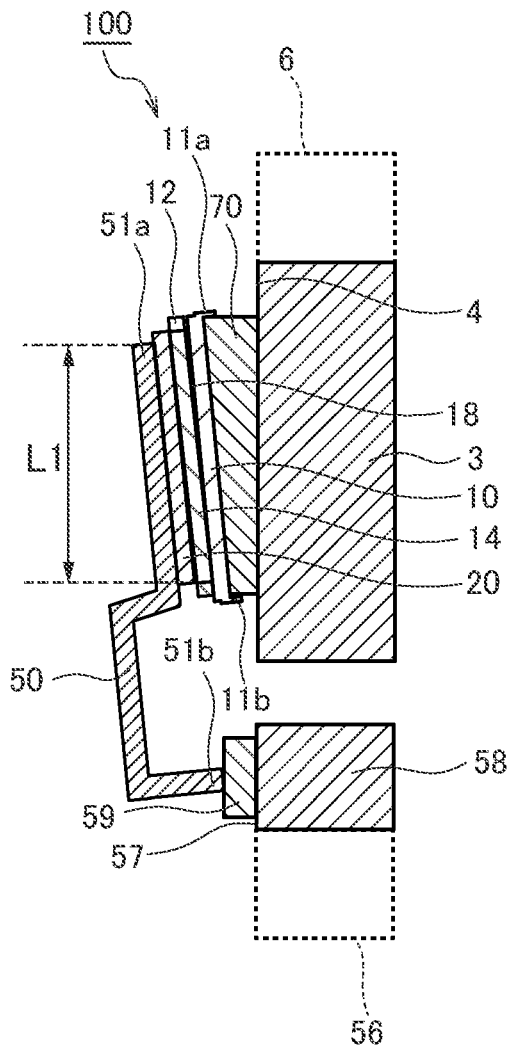
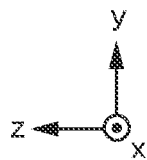
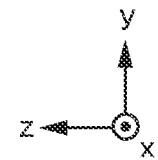

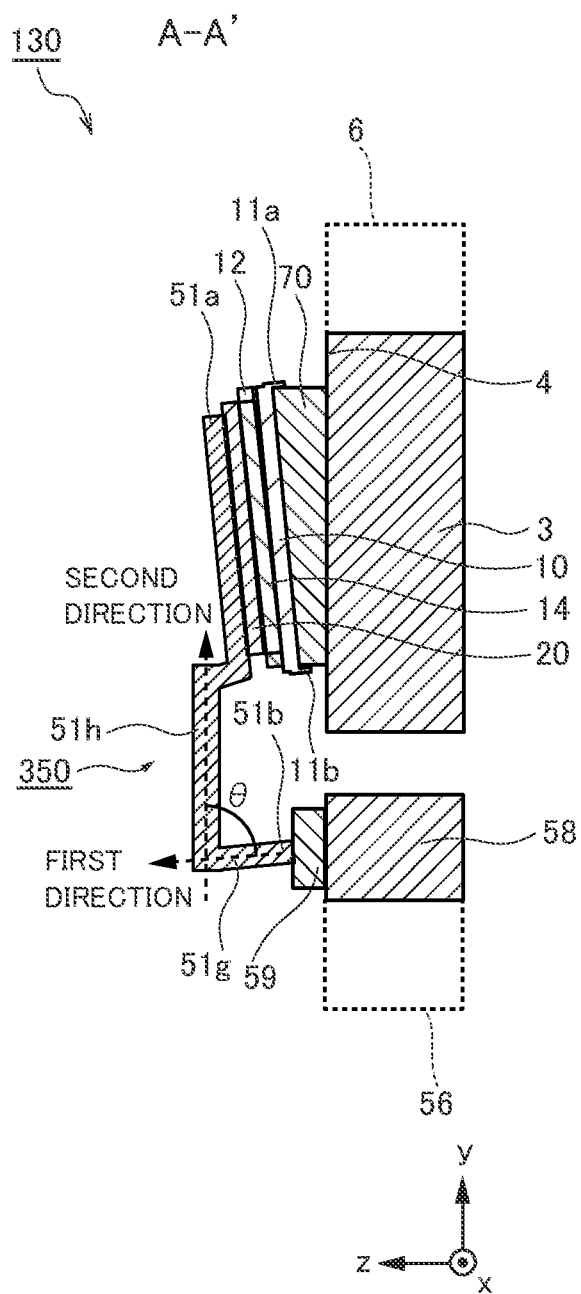

SEMICONDUCTOR DEVICE

CROSS-REFERENCE TO RELATED APPLICATION

This application is based upon and claims the benefit of priority from Japanese Patent Application No. 2022-044756, filed on Mar. 19, 2022, the entire contents of which are incorporated herein by reference.

FIELD

Embodiments described herein relate generally to semiconductor device.

BACKGROUND

A semiconductor device having a semiconductor chip such as a metal oxide semiconductor field effect transistor (MOSFET) is used for applications such as power conversion. For example, when semiconductor device described above is a vertical MOSFET, a source electrode provided on an upper surface of a semiconductor chip is connected to a connector provided on MOSFET, for example. Both planes of MOSFET are joined to connectors and leads via solder, but void content in the solder may reduce the heat dissipation of safe operation area, resulting in a thermal runaway weak structure.

BRIEF DESCRIPTION OF THE DRAWINGS

FIGS. 2A-2B are a schematic cross-sectional view of a main part of the semiconductor device of the first embodiment;

FIGS. 5A-5B are a schematic cross-sectional view of a main part of a semiconductor device of a second embodiment;

FIG. 8 is a schematic cross-sectional view of a semiconductor device of a fourth embodiment.

DETAILED DESCRIPTION

Figure 1A:
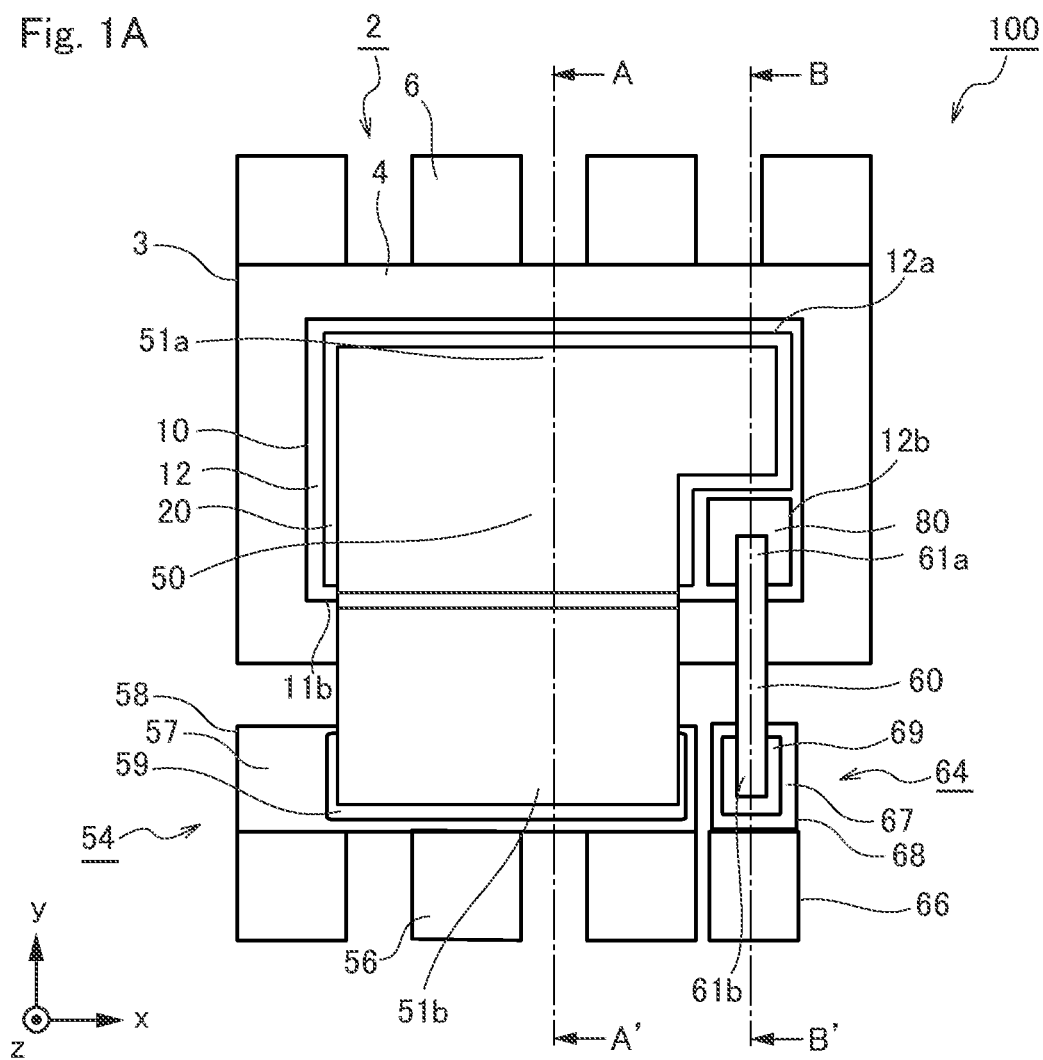
FIGS. 1A-1B are a schematic top view of a semiconductor device of a first embodiment.

The semiconductor device of the embodiment includes a lead frame including a first bed including a first upper surface and a first outer lead connected to the first bed; a first post including a second bed including a second upper surface and a second outer lead connected to the second bed, and the first bed being provided between the first outer lead and the first post; a second post including a third bed including a third upper surface and a third outer lead connected to the third bed; a semiconductor chip provided on the first upper surface, the semiconductor chip including a fourth upper surface having an electrode and a control electrode, and an insulating film provided on the fourth upper surface, and the insulating film including a first opening provided on the electrode and a second opening provided on the control electrode; a first bonding material provided between the first upper surface and the semiconductor chip, the first bonding material joining the first upper surface and the semiconductor chip, the first bonding material including a first bonding material portion and a second bonding material portion, a first film thickness of the first bonding material portion below the control electrode being thinner than a second film thickness of the second bonding material portion on the second portion of the first bed, the second portion being provided between the first portion of the first bed below the first bonding material portion and the first outer lead; a first connector having a first end provided on the electrode and a second end provided on the second upper surface; a second bonding material provided between the electrode and the first end, the second bonding material joining the electrode and the first end; and a third bonding material provided between the second upper surface and the second end, the third bonding material joining the control electrode and the second end.

Hereinafter, embodiments of the present disclosure will be described with reference to the drawings. Note that in the following description, the same members and the like are denoted by the same reference numerals, and description of members and the like once described is appropriately omitted.

In this specification, in order to illustrate the positional relationship of parts and the like, the upward direction of the drawings may be referred to as "upper", and the downward direction of the drawings may be referred to as "lower". Here, the terms "up" and "down" do not necessarily indicate a relationship with the direction of gravity.

First Embodiment

The semiconductor device of the present embodiment includes a lead frame including a first bed including a first upper surface and a first outer lead connected to the first bed; a first post including a second bed including a second upper surface and a second outer lead connected to the second bed, and the first bed being provided between the first outer lead and the first post; a second post including a third bed including a third upper surface and a third outer lead connected to the third bed; a semiconductor chip provided on the first upper surface, the semiconductor chip including a fourth upper surface having an electrode and a control electrode, and an insulating film provided on the fourth upper surface, and the insulating film including a first opening provided on the electrode and a second opening provided on the control electrode; a first bonding material provided between the first upper surface and the semiconductor chip, the first bonding material joining the first upper surface and the semiconductor chip, the first bonding material including a first bonding material portion and a second bonding material portion, a first film thickness of the first bonding material portion below the control electrode being thinner than a second film thickness of the second bonding material portion on the second portion of the first bed, the second portion being provided between the first portion of the first bed below the first bonding material portion and the first outer lead; a first connector having a first end provided on the electrode and a second end provided on the second upper surface; a second bonding material provided between the electrode and the first end, the second bonding material joining the electrode and the first end; and a third bonding material provided between the second upper surface and the second end, the third bonding material joining the control electrode and the second end.

Figure 1B:
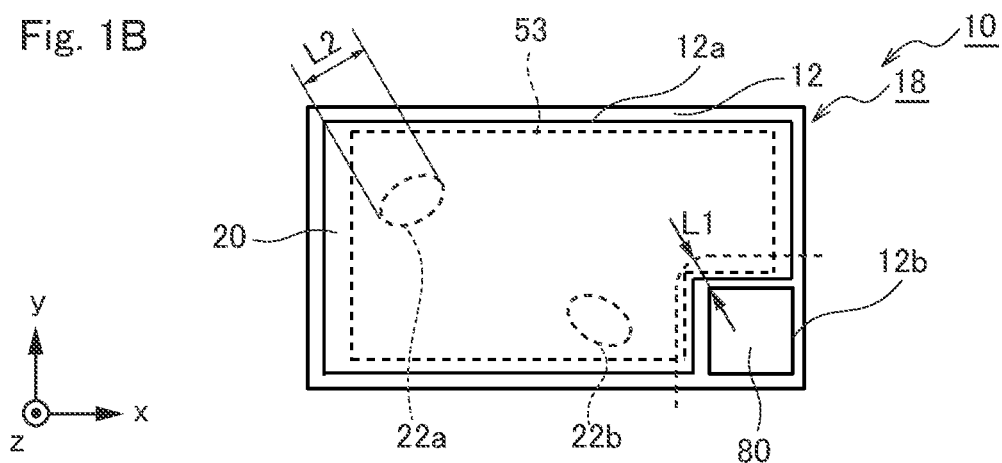

FIGS. 1A-1B are a schematic top view of the semiconductor device 100 of the present embodiment. FIG. 1A is a schematic top view of the semiconductor device 100 of the present embodiment. FIG. 1B is a schematic top view illustrating a semiconductor chip 10, an insulating film 12, a second bonding material 20, and a fourth bonding material 80 of the present embodiment. FIGS. 2A-2B are a schematic cross-sectional view of a main part of the semiconductor device 100 of the present embodiment. FIG. 2A is a schematic view of a cross section taken along line A-A' in FIG. 1. FIG. 2B is a schematic diagram of a cross section taken along line B-B' in FIG. 1.

The semiconductor device 100 of the present embodiment will be described using FIGS. 1A-1B and FIGS. 2A-2B.

A lead frame 2 is a member on which a semiconductor chip 10 is disposed and includes a conductive material such as Cu (copper). The lead frame 2 includes a first bed 3 and a first outer lead 6. The first bed 3 includes a first upper surface 4. The semiconductor chip 10 is provided on the first upper surface 4. The first outer lead 6 is connected to the first bed 3. The first outer lead 6 is used to connect the semiconductor chip 10 and an external circuit (not shown).

Here, an X-direction, a Y-direction intersecting perpendicularly to the X-direction, and a Z-direction intersecting perpendicularly to the X-direction and the Y-direction are defined. The first upper surface 4 is disposed parallel to the XY plane.

A first post (first lead post, source lead post) 54 includes a second bed 58 and a second outer lead 56. The first post 54 includes a conductive material such as Cu. A second bed 58 includes a second upper surface 57. Here, the first bed 3 is provided so as to be disposed between the first outer lead 6 and the first post 54. The second outer lead 56 is used for connecting the semiconductor chip 10 and an external circuit (not shown).

A second post (second lead post, gate lead post) 64 includes a third bed 68 and a third outer lead 66. The third bed 68 includes a third upper surface 67. The second post 64 includes a conductive material such as Cu. Here, for example, the first bed 3 is provided so as to be disposed between the first outer lead 6 and the second post 64. The third outer lead 66 is used for connecting the semiconductor chip 10 and an external circuit (not shown).

For example, the second post 64 is provided adjacently to the first post 54. For example, the second post 64 is provided alongside the first post 54.

The semiconductor chip 10 is provided on the first upper surface 4 of the lead frame 2. The semiconductor chip 10 is, for example, a chip in which the vertical MOSFET or an IGBT(Insulated Gate Bipolar Transistor) or the like is provided on a semiconductor substrate such as an Si (silicon) substrate, an SiC (silicon carbide) substrate, a GaAs (gallium arsenide) substrate, or a GaN (gallium nitride) substrate.

The semiconductor chip 10 includes a fourth upper surface 18. An electrode 14 and a control electrode 16 are provided on the fourth upper surface 18. For example, if the semiconductor chip 10 has a MOSFET, the electrode 14 corresponds to a source electrode of the MOSFET. Further, if the semiconductor chip 10 has a MOSFET, the control electrode 16 corresponds to a gate electrode of the MOSFET.

The semiconductor chip 10 has the insulating film 12. The insulating film 12 is provided on the fourth upper surface 18. The insulating film 12 includes a first opening 12a and a second opening 12b. Each of the first opening 12a and the second opening 12b passes through the insulating film 12. The first opening 12a is provided on the electrode 14. The second opening 12b is provided on the control electrode 16. The insulating film 12, for example, includes insulating materials such as polyimides.

A first bonding material 70 is provided between the first upper surface 4 and the semiconductor chip 10. The first bonding material 70 joins (bonds) the first upper surface 4 and the semiconductor chip 10. For example, if the semiconductor chip 10 is provided with a MOSFET, the first bonding material 70 joins a drain electrode of the semiconductor chip 10 and the first upper surface 4 (not shown).

A first film thickness $t_1$ of a first bonding material portion 70a of the first bonding material 70 below the control electrode 16 is thinner than a second film thickness $t_2$ of a second bonding material portion 70b on the second portion 3b of the first bed 3. Here, the second portion 3b is provided between the first portion 3a of the first bed 3 below the first bonding material portion 70a and the first outer lead 6 (FIG. 2B).

A difference between the second film thickness $t_2$ and the first film thickness $t_1$ is preferably 15 μm or more. Incidentally, the difference between the second film thickness $t_2$ and the first film thickness $t_1$ is, more preferably, 30 μm or more.

A first connector 50 includes a first end 51a and a second end 51b. The first end 51a is provided on the electrode 14. The second end 51b is provided on the second upper surface 57. The first connector 50 includes, for example, a conductive material such as Cu. The surfaces of the first connector 50 may be provided with, for example, an inorganic adhesion reinforcing layer containing Fe and Cr and covalently bonded to an epoxy resin to form a triple bond between the epoxy resin and M-O—Si (O—Si, and M is a metallic element) or an organic adhesion reinforcing layer serving as a M-O-polymer bond. Further, the surfaces of the first connector 50 may be subjected to surface roughening such as blackening treatment of roughening the Cu surface with sulfuric acid.

The second bonding material 20 is provided between the electrode 14 and the first end 51a. The second bonding material 20 joins the electrode 14 and the first end 51a.

A third bonding material 59 is provided between the second upper surface 57 and the second end 51b. The third bonding material 59 joins the second upper surface 57 and the second end 51b.

The second connector 60 has a third end 61a and a fourth end 61b. The secondary connector 60 includes, for example, a conductive material such as Cu. The surfaces of the second connector 60 may be provided with, for example, an inorganic adhesion reinforcing layer containing Fe and Cr and covalently bonded to an epoxy resin to form a triple bond between the epoxy resin and M-O—Si (O—Si, and M is a metallic element) or an organic adhesion reinforcing layer serving as a M-O-polymer bond. Further, the surfaces of the second connector 60 may be subjected to surface roughening such as blackening treatment of roughening the Cu surface with sulfuric acid. The third end 61a is electrically connected to the semiconductor chip 10 via a fourth bonding material 80 provided on the control electrode 16.

Incidentally, the first connector 50 and the secondary connector 60 cannot be easily bent and are hard connectors, which are different from wires used for bonding.

Note that a wire may be used instead of the second connector 60.

A fifth bonding material 69 is provided between the third upper surface 67 and the fourth end 61b. The fifth bonding material 69 joins the third upper surface 67 and the fourth end 61b.

The second bonding material 20 may include a void 22 in the second bonding material 20. In FIG. 1B, a void 22a and a void 22b are shown. However, it is preferable that the first bonding material 70 which is provided below the second opening 12b and which is provided within a distance $L_1$ of 1 mm from the second opening 12b does not have a void.

A junction 53 is a portion where the first end 51a is joined to the second bonding material 20. In FIG. 1B, the junction 53 is shown as a dashed line. The first bonding material 70 below the junction 53 of the first end 51a joined to the second bonding material 20 may include the void 22 having a maximum diameter of 15 µm or larger.

The largest diameter of the void 22 can be measured, for example, by a cross-sectional micrograph or the like.

The area of the junction 53 of the first end 51a joined to the second bonding material 20 is preferably 80% or more of the area of the fourth upper surface 18.

As the first bonding material 70, the second bonding material 20, the third bonding material 59, the fourth bonding material 80, and the fifth bonding material 69, for example, solder containing Pb (lead) and Sn (tin), solder containing Pb, Ag (silver), and Sn (tin), solder containing Sn and Sb (antimony), solder containing Au (gold) and Sn, solder containing Au and Si, or solder containing Au and Ge (germanium) can be preferably used. The first bonding material 70, the second bonding material 20, the third bonding material 59, the fourth bonding material 80, and the fifth bonding material 69 are, for example, a first solder, a second solder, a third solder, a fourth solder, and a fifth solder, respectively.

Figure 3:
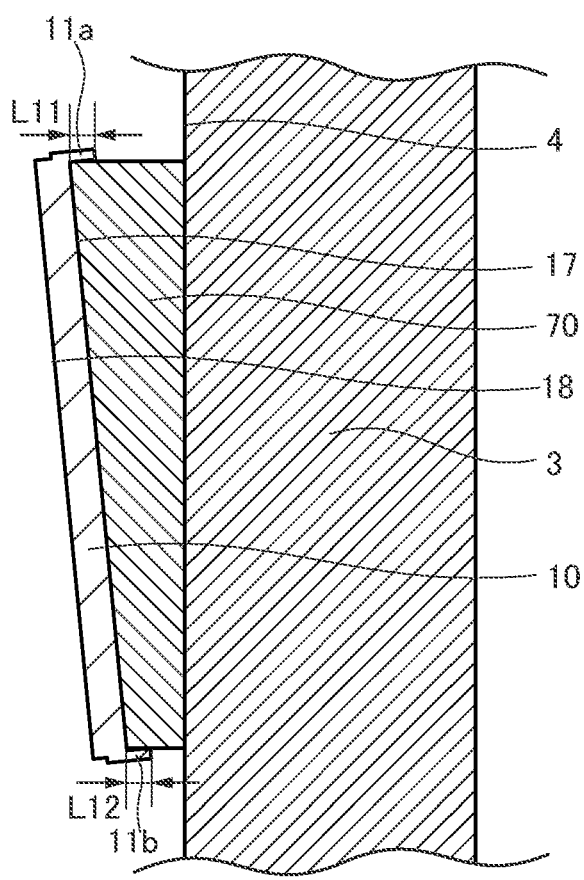
FIG. 3 is a schematic cross-sectional view of a main part of the semiconductor device of the first embodiment.

FIG. 3 is a schematic cross-sectional view showing a main part of the semiconductor device 100 of the embodiment. In FIG. 3, among semiconductor device 100, the first bed 3, the first bonding material 70 and the semiconductor chip 10 are shown. The semiconductor chip 10 may have a burr that is 15 µm or more in length in a direction perpendicular to the fourth upper surface 18 and protrudes downward from the bottom surface 17 of the semiconductor chip 10. In FIG. 3 and FIG. 2A, a burr 11a and a burr 11b are shown. The length $L_{11}$ of the burr 11a in the direction perpendicular to the fourth upper surface 18 may be 15 µm or more. The length $L_{12}$ of the burr 11b in the direction perpendicular to the fourth upper surface 18 may be 15 µm or more.

In FIG. 2B, a burr 11c and a burr 11d are shown. For the burr 11c and the burr 11d, similarly to the burr 11a and the burr 11b, the length in the direction perpendicular to the first upper surface 4 may be 15 µm or more.

Next, the operation and effects of the semiconductor device of the present embodiment will be described.

Figure 4A:
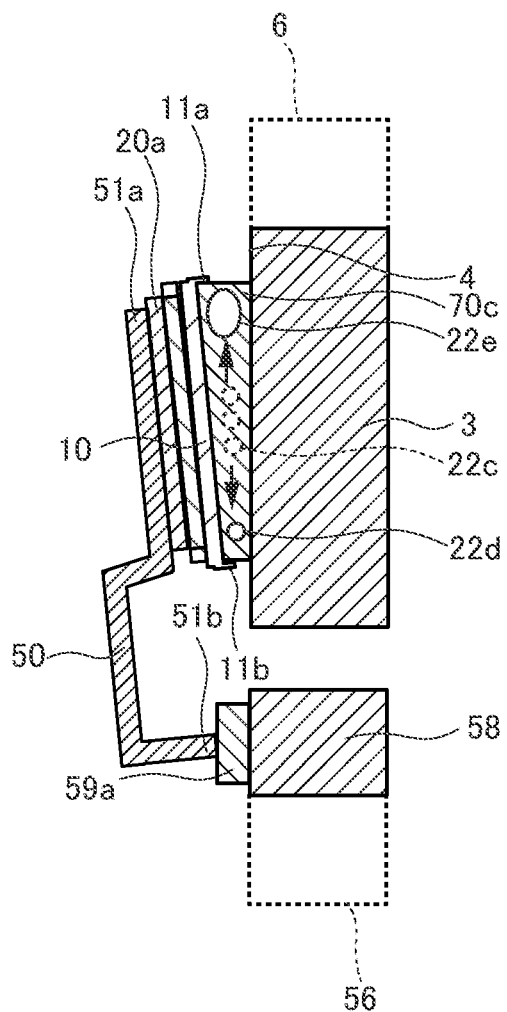
FIGS. 4A-4B are a schematic cross-sectional view for explaining a function and an effect of the semiconductor device of the first embodiment.
Figure 4B:
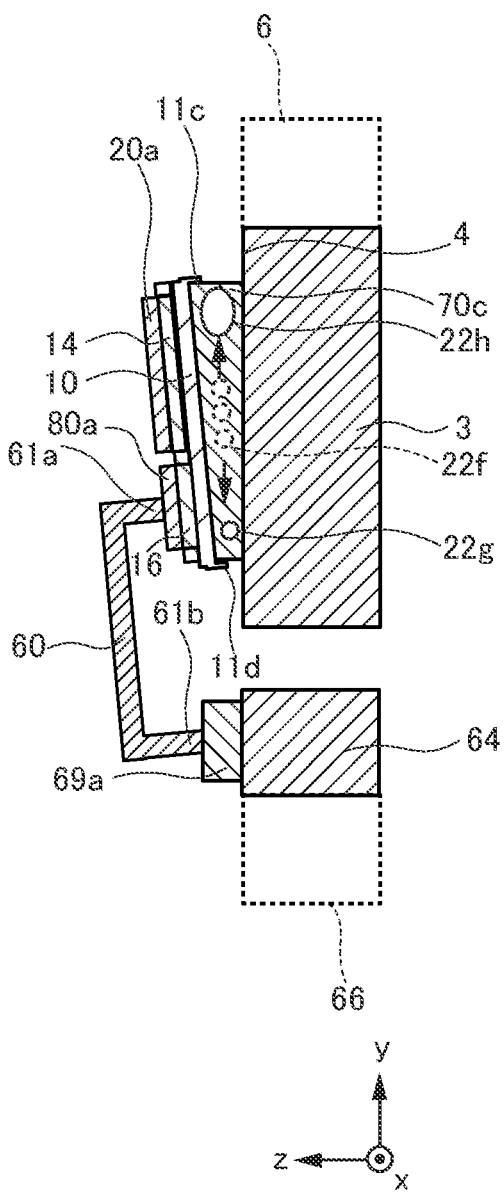

FIGS. 4A-4B are a schematic cross-sectional view for explaining the operation and effectiveness of the semiconductor device of the present embodiment. FIGS. 4A-4B is a schematic cross-sectional view showing a part of the manufacturing process of the semiconductor device 100.

In FIG. 4A and FIG. 4B, a first cream solder 70c to be the first bonding material 70 after curing, a second cream solder 20a to be the second bonding material 20 after curing, a third cream solder 59a to be the third bonding material 59 after curing, a fourth cream solder 80a to be the fourth bonding material 80 after curing, and a fifth cream solder 69a to be the fifth bonding material 69 after curing, are illustrated. In such a condition, the semiconductor device in the middle of manufacturing, for example, is heated in a vacuum to perform reflow. At this time, the void 22 containing fluxing components, water and the like contained in the cream solder is formed. In FIG. 4A, voids 22c are shown as the formed void 22. In FIG. 4B, voids 22f are shown as the formed void 22. As described above, since the heat is applied in vacuum, the voids 22c are about to be released to the outside of the first creamed solder 70c. Therefore, the voids 22c moves to an end of the first cream solder 70c, and become a void 22d and a void 22e. Similarly, the voids 22f are about to be released to the outside of the first cream solder 70c. Therefore, the voids 22f become a void 22g and a void 22h. Here, when the first cream solder 70c is cured into the first bonding material 70, the void 22 may remain inside the first bonding material 70 without being released to the outside of the first bonding material 70. Such void 22, as compared with the portion where other first bonding material 70 is provided, is considered to have higher thermal resistivity. This is because, compared to electrically conductive material such as metal included in the first bonding material 70, the thermal conductivity of the flux components and moisture contained in the void 22 is considered to be lower. Also, if the void 22 in the first bonding material 70 remains, the electrical resistivity of the portion of the void 22 is larger than the electrical resistivity of the portion of the other first bonding material 70. Therefore, when the void 22 remains, the magnitude of the current that can be energized becomes small. Therefore, such void 22 narrows safe operation area of the semiconductor device 100, reducing the reliability.

The degree to which the void 22 has an adverse effect on reliability depends on where the void 22 is formed. Part of the heat generated in the semiconductor chip 10, for example, is transmitted to the outside of the first semiconductor chip 10 via the first end 51a of the first connector 50. Here, the void 22 may remain below and around the control electrode 16. In this case, since the distance between the first end 51a and the void 22 is relatively long, the heat generated from below the control electrode 16 and its periphery of the control electrode 16 become difficult to pass through the first end 51a of the first connector 50. Therefore, it was required not to leave the void 22 below and around the control electrode 16.

Further, the semiconductor chip 10 may have a burr 11 protruding downward from the semiconductor chip 10 during dicing. Such the burr 11 may inhibit the release of the void 22 to the outside of first bonding material 70.

Therefore, semiconductor device 100 of the present embodiment includes a first bonding material provided between the first upper surface and the semiconductor chip, the first bonding material joining the first upper surface and the semiconductor chip, the first bonding material including a first bonding material portion and a second bonding material portion, a first film thickness $t_1$ of the first bonding material portion below the control electrode being thinner than a second film thickness $t_2$ of the second bonding material portion on the second portion of the first bed, the second portion being provided between the first portion of the first bed below the first bonding material portion and the first outer lead.

According to the semiconductor device 100 of the present embodiment, the formed void 22c and void 22f, inside the first cream solder 70c, move toward the larger film thickness of the first cream solder 70c. Because moving toward the larger film thickness is easier than moving toward the smaller film thickness because the moving resistance is smaller. Therefore, below and around control electrode 16, the void 22 is less likely to remain. Therefore, the thermal resistivity of the semiconductor device can be kept low. Further, it is possible to ensure the magnitude of the current that can be energized in the semiconductor device. Therefore, it is possible to provide the semiconductor device having wide safe operation area and high reliability.

Incidentally, the difference between the second film thickness $t_2$ and the first film thickness $t_1$ is preferably 15 µm or more. This is to facilitate the movement of the void 22 within the first cream solder 70c. Further, the void 22 having a maximum diameter of 15 µm or more, in particular, deteriorates the thermal conductivity. Therefore, it is preferable to easily move the void 22 having a largest diameter of 15 µm or more by providing the difference between the second film thickness $t_2$ and the first film thickness $t_1$ 15 µm or more.

It is preferable that the first bonding material 70 which is provided below the second opening 12b and which is provided within a distance $L_1$ of 1 mm from the second opening 12b does not have a void. This is because if the void 22 remains in such a location, the reduction in reliability due to deterioration of thermal conductivity is problematic.

The first bonding material 70 below the junction 53 of the first end 51a bonded to the second bonding material 20 may include the void 22 having a maximum diameter of 15 µm or larger. This is because the reliability is relatively difficult to degrade. This is because even if the first bonding material 70 below the junction 53 includes a void 22 having a maximum diameter of 15 µm or more, heat easily escapes from the first end 51a.

The area of the junction 53 of the first end 51a bonded to the second bonding material 20 is preferably 80% or more of the area of the fourth upper surface 18. This is because, since the area of the junction 53 is large, even if the void 22 is left, the heat easily escapes from the first end 51a.

In the semiconductor device 100, the semiconductor chip 10 may have a burr that is 15 µm or more in length in a direction perpendicular to the fourth upper surface 18 and protrudes downward from the bottom surface 17 of the semiconductor chip 10. This is because the void 22 can be easily released even if the semiconductor chip 10 has the burr 11 because the film thickness of the first bonding material 70 has the above relation.

According to the semiconductor device of the present embodiment, it is possible to provide the semiconductor device having large safe operation area and high reliability.

Second Embodiment

The semiconductor device of the present embodiment is different from the semiconductor device of the first embodiment in that, when viewed from above, the area of the junction of the first end joined to the second bonding material is 50% or more and 70% or less of the area of the fourth upper surface.

Further, the semiconductor device of the present embodiment is different from the semiconductor device of the first embodiment in that, when viewed from above, the center of the junction of the first end joined to the second bonding material is disposed between the center of the first opening and the first post.

Here, description of the same content as that of the first embodiment is omitted.

Figure 6:
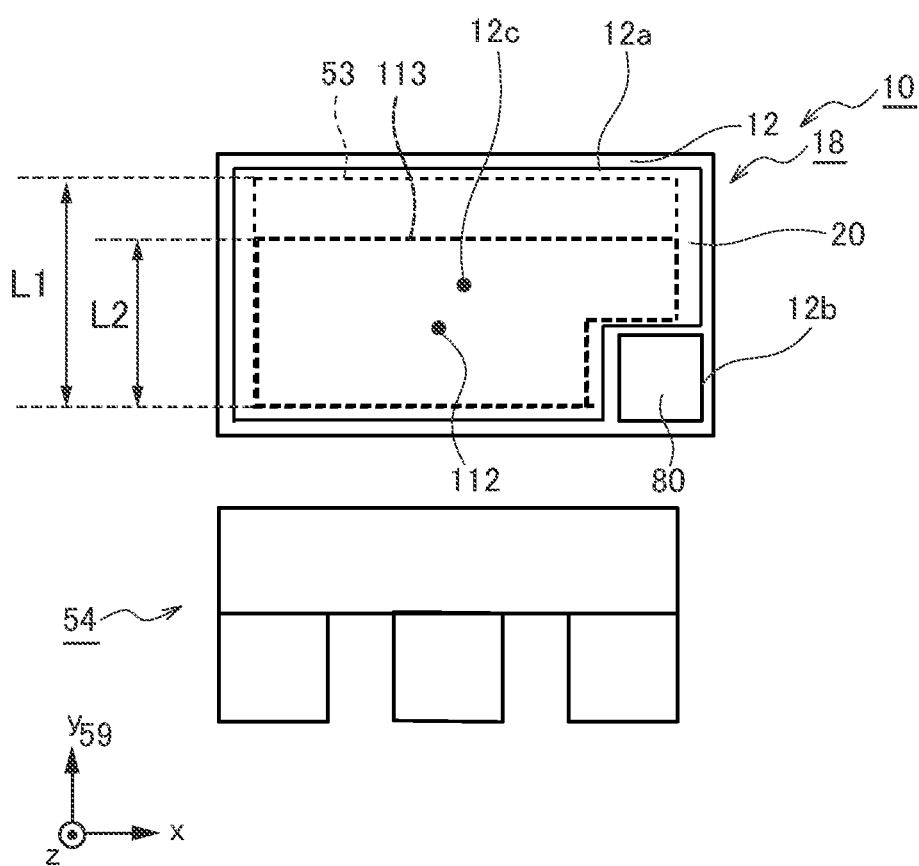
FIG. 6 is a schematic top view of the main part of the semiconductor device of the second embodiment.

FIGS. 5A-5B are a schematic cross-sectional view of a semiconductor device 110 according to the present embodiment. FIG. 5A is a schematic cross-sectional view of a semiconductor device 110 according to the present embodiment. Incidentally, in FIG. 5B, schematic cross-sectional view of the semiconductor device 100 of the first embodiment is shown for comparative purposes. FIG. 6 is a schematic top view of the main part of semiconductor device 110 of this embodiment. FIG. 6 is a schematic top view illustrating the semiconductor chip 10, the insulating film 12, the second bonding material 20, the first post 54, and the fourth bonding material 80 of the present embodiment.

The semiconductor device 110 of the present embodiment will be explained using FIGS. 5A-5B and FIG. 6.

In the semiconductor device 110 of the present embodiment, when viewed from above, in other words, when viewed from the Z direction, the length in the Y direction of junction 113 of the first end 51a bonded to the second bonding material 20 is $L_2$. On the other hand, in the semiconductor device 100 of the first embodiment, when viewed from above, the length in the Y-direction of the junction 53 of the first end 51a bonded to the second bonding material 20 is $L_1$. $L_1$ is longer than $L_2$.

Thus, when viewed from above, the area of the junction 113 of the first end 51a joined to the second bonding material 20 can be 50% or more and 70% or less of the area of fourth upper surface 18.

Further, when viewed from above, the center 112 of the junction 113 of the first end 51a joined to the second bonding material 20 is disposed between the center 12c of the first opening 12a and the first post 54.

Incidentally, the method of setting the area of the junction 113 of the first end 51a joined to the second bonding material 20 to 50% or more and 70% of the area of the fourth upper surface 18 when viewed from above is not limited to that described above.

Also, the method of setting the center 112 of the junction 113 of the first end 51a joined to the second bonding material 20 is disposed between the center 12c of the first opening 12a and the first post 54 when viewed from above is not limited to that described above.

According to the semiconductor device 110 of the present embodiment, the first connector 50 is easily inclined toward the first post 54. Therefore, it is possible to easily realize the first bonding material 70 in which the first film thickness $t_1$ of the first bonding material portion 70a of the first bonding material 70 below control electrode 16 is thinner than the second film thickness $t_2$ of the second bonding material portion 70b on the second portion 3b of the first bed 3 provided between the first portion 3a of the first bed 3 below the first bonding material portion 70a and the first outer lead 6.

According to the semiconductor device of the present embodiment, it is possible to provide the semiconductor device having large safe operation area and high reliability.

Third Embodiment

The semiconductor device of the present embodiment is different from the semiconductor device of the first and second embodiments in that a distance between the center of gravity of the first connector and a tip of the first end is longer than a distance between the center of gravity of the first connector and a tip of the second end. Here, description of contents overlapping with the first and second embodiments is omitted.

Figure 7A:
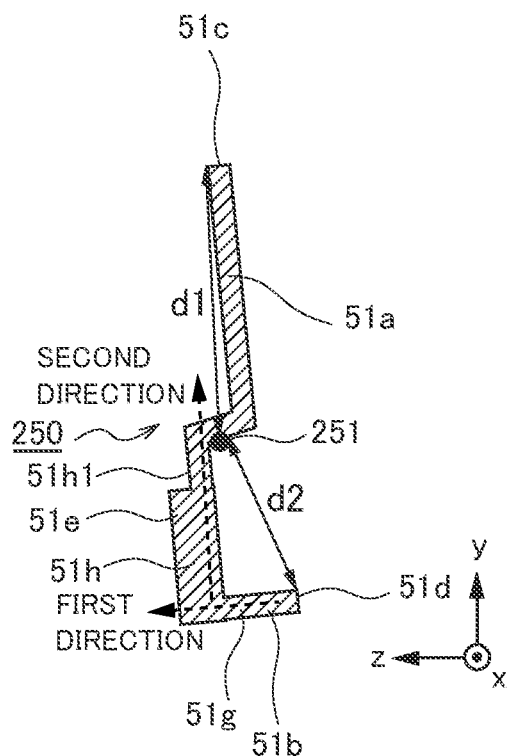
FIGS. 7A-7B are a schematic cross-sectional view of a first connector used in a semiconductor device of a third embodiment.
Figure 7B:
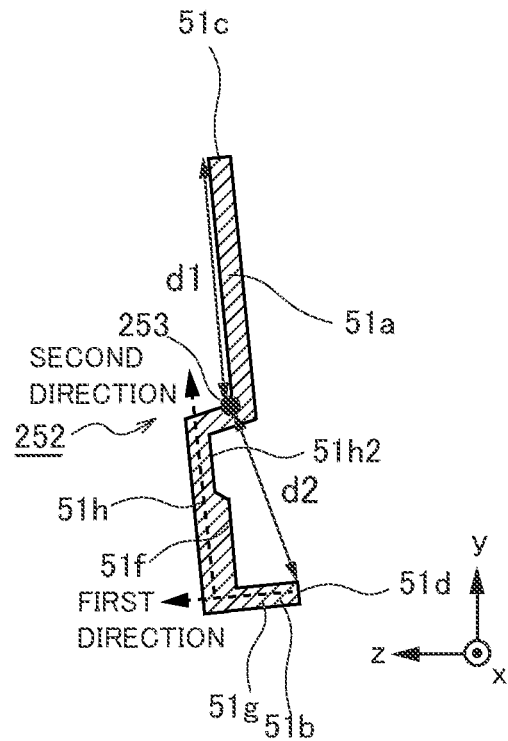

FIGS. 7A-7B are a schematic cross-sectional view of the first connector used in the semiconductor device of the present embodiment.

FIG. 7A is a schematic cross-sectional view of the first connector 250 used in the semiconductor device of the present embodiment. The first connector 250 includes a third connector 51g including the second end 51b and extending in a first direction and a fourth connector 51h connected to the third connector 51g and extending in a second direction intersecting the first direction. The fourth connector 51h includes a protrusion 51e on the upper surface 51h1 of the fourth connector 51h. The distance $d_1$ between the center of gravity 251 of the first connector 250 and the tip 51c of the first end 51a is longer than the distance $d_2$ between the center of gravity 251 of the first connector 250 and the tip 51d of the second end 51b.

FIG. 7B is a schematic cross-sectional view of the first connector 252 used in the semiconductor device of the present embodiment. The fourth connector 51h includes a protrusion 51f on the lower surface 51h2 of the fourth connector 51h. The distance $d_1$ between the center of gravity 253 of the first connector 252 and the tip 51c of the first end 51a is longer than the distance $d_2$ between the center of gravity 251 of the first connector 252 and the tip 51d of the second end 51b.

By using the first connector 250 or the first connector 252 of the present embodiment, the first connector 250 or the first connector 252 is easily inclined toward the first post 54. Therefore, it is possible to easily realize the first bonding material 70 in which the first film thickness $t_1$ of the first bonding material portion 70a of the first bonding material 70 below control electrode 16 is thinner than the second film thickness $t_2$ of the second bonding material portion 70b on the second portion 3b of the first bed 3 provided between the first portion 3a of the first bed 3 below the first bonding material portion 70a and the first outer lead 6.

According to the semiconductor device of the present embodiment, it is possible to provide the semiconductor device having large safe operation area and high reliability.

Fourth Embodiment

The semiconductor device of the present embodiment is different from the semiconductor device of the first to third embodiments in that the first connector includes a third connector (first connector portion) including the second end and extending in the first direction, and a fourth connector (second connector portion) connected to the third connector, extending in the second direction intersecting first direction at an angle of less than 90 degrees. Here, descriptions of the same contents as those of the first to third embodiments are omitted.

FIG. 8 is a schematic cross-sectional view of a semiconductor device 130 according to the present embodiment. The angle θ at which the first direction in which the third connector 51g extends and the second direction in which the fourth connector 51h extends intersect is less than 90 degrees.

By using the first connector 350 of the present embodiment, the first connector 350 is more easily inclined toward the first post 54. Therefore, it is possible to easily realize the first bonding material 70 in which the first film thickness $t_1$ of the first bonding material portion 70a of the first bonding material 70 below the control electrode 16 is thinner than the second film thickness $t_2$ of the second bonding material portion 70b on the second portion 3b of the first bed 3 provided between the first portion 3a of the first bed 3 below the first bonding material portion 70a and the first outer lead 6.

According to the semiconductor device of the present embodiment, it is possible to provide the semiconductor device having large safe operation area and high reliability.

Fifth Embodiment

The semiconductor device of the present embodiment is different from the semiconductor device of the first to fourth embodiments in that the first end includes a fifth connector (third connector portion) in contact with the second bonding material and a sixth connector (fourth connector portion) in contact with the second bonding material, a distance between the sixth connector and the second end is shorter than a distance between the fifth connector and the second end, and a thickness of the fifth connector in the direction perpendicular to the first top surface is thinner than the thickness of the sixth connector in the direction perpendicular to the first top surface. Here, descriptions of the same contents as those of the first to fourth embodiments are omitted.

Figure 9:
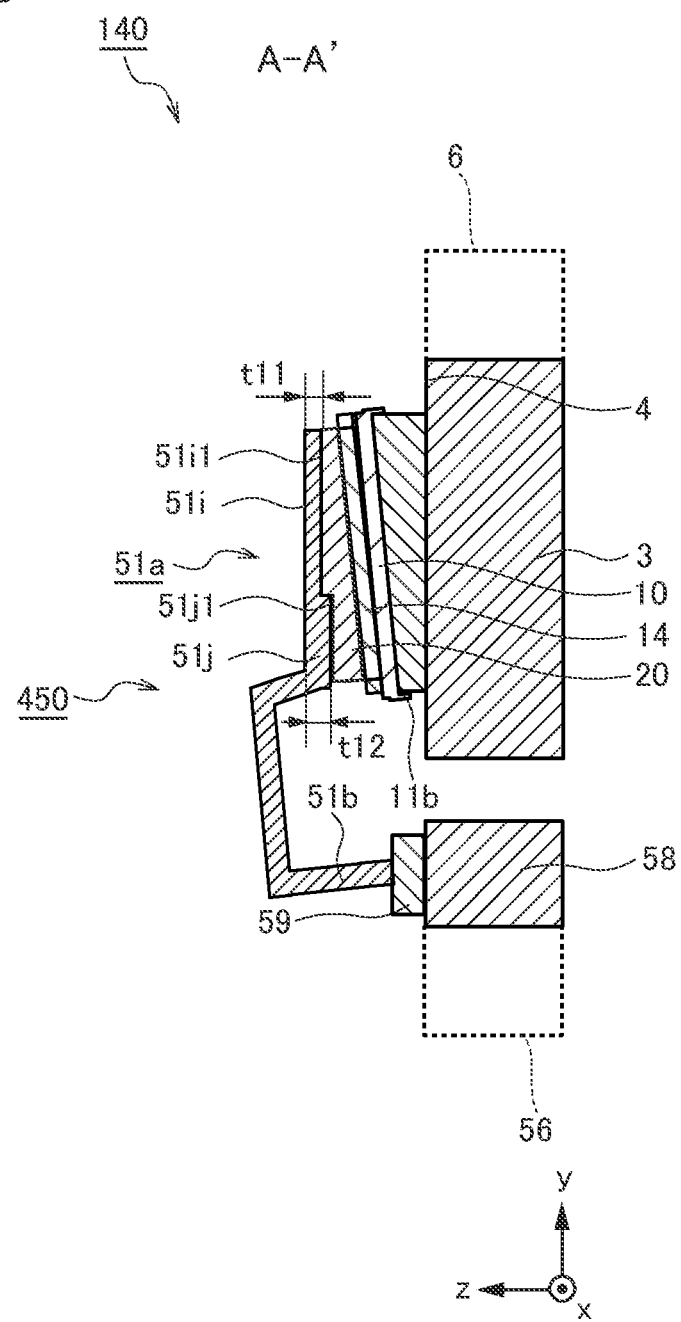
FIG. 9 is a schematic cross-sectional view of a semiconductor device of a fifth embodiment.

FIG. 9 is a schematic cross-sectional view of a semiconductor device 140 according to the present embodiment.

In first connector 450 of the present embodiment, the first end 51a includes the fifth connector 51i in contact with the second bonding material 20 and the sixth connector 51j in contact with the second bonding material 20. The distance between the sixth connector 51j and the second end 51b is shorter than a distance between the fifth connector 51i and the second end 51b. The thickness of the fifth connector 51i $t_{11}$ in the direction perpendicular to the first top surface 4 is thinner than the thickness of the sixth connector 51j $t_{12}$ in the direction perpendicular to the first top surface 4. Then, a lower surface 51j1 of the sixth connector 51j protrudes downward more than a lower surface 51i1 of the fifth connector 51i.

By using the first connector 450 of the present embodiment, the first connector 350 is more easily inclined toward the first post 54. Therefore, it is possible to easily realize the first bonding material 70 in which the first film thickness $t_1$ of the first bonding material portion 70a of the first bonding material 70 below the control electrode 16 is thinner than the second film thickness $t_2$ of the second bonding material portion 70b on the second portion 3b of the first bed 3 provided between the first portion 3a of the first bed 3 below the first bonding material portion 70a and the first outer lead 6.

According to the semiconductor device of the present embodiment, it is possible to provide the semiconductor device having large safe operation area and high reliability.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a lead frame including a first bed including a first upper surface and a first outer lead connected to the first bed;
a first post including a second bed including a second upper surface and a second outer lead connected to the second bed, and the first bed being provided between the first outer lead and the first post;
a second post including a third bed including a third upper surface and a third outer lead connected to the third bed;

a semiconductor chip provided on the first upper surface, the semiconductor chip including
  a fourth upper surface having an electrode and a control electrode, and
  an insulating film provided on the fourth upper surface, and the insulating film including a first opening provided on the electrode and a second opening provided on the control electrode;
a first bonding material provided between the first upper surface and the semiconductor chip, the first bonding material joining the first upper surface and the semiconductor chip, the first bonding material including a first bonding material portion and a second bonding material portion, a first film thickness of the first bonding material portion below the control electrode being thinner than a second film thickness of the second bonding material portion on the second portion of the first bed, the second portion being provided between the first portion of the first bed below the first bonding material portion and the first outer lead;
a first connector having a first end provided on the electrode and a second end provided on the second upper surface;
a second bonding material provided between the electrode and the first end, the second bonding material joining the electrode and the first end; and
a third bonding material provided between the second upper surface and the second end, the third bonding material joining the control electrode and the second end.

2. The semiconductor device according to claim 1, wherein a difference between the second film thickness and the first film thickness is 15 µm or more.

3. The semiconductor device according to claim 1, wherein the first bonding material provided below the second opening and provided within a distance of 1 mm from the second opening does not have a void.

4. The semiconductor device according to claim 1, wherein the first bonding material below a junction of the first end joined to the second bonding material may include a void having a maximum diameter of 15 µm or larger.

5. The semiconductor device according to claim 1, wherein an area of a junction of the first end joined to the second bonding material is preferably 80% or more of an area of the fourth upper surface.

6. The semiconductor device according to claim 1,
wherein, when viewed from above, an area of a junction of the first end joined to the second bonding material is 50% or more and 70% or less of the area of the fourth upper surface, and
wherein, when viewed from above, the center of the junction of the first end joined to the second bonding material is disposed between the center of the first opening and the first post.

7. The semiconductor device according to claim 1,
wherein a distance between the center of gravity of the first connector and a tip of the first end is longer than a distance between the center of gravity of the first connector and a tip of the second end.

8. The semiconductor device according to claim 7,
wherein the first connector includes a third connector including the second end and extending in a first direction and a fourth connector connected to the third connector and extending in a second direction intersecting the first direction, and
the fourth connector includes a protrusion on the upper surface or the lower surface of the fourth connector.

9. The semiconductor device according to claim 1,
wherein the first connector includes
  a third connector including the second end and extending in a first direction, and
  a fourth connector connected to the third connector, and the fourth connector extends in a second direction intersecting the first direction at an angle of less than 90 degrees.

10. The semiconductor device according to claim 1,
wherein the first end includes
  a fifth connector in contact with the second bonding material, and
  a sixth connector in contact with the second bonding material, a distance between the sixth connector and the second end is shorter than a distance between the fifth connector and the second end, and
  a thickness of the fifth connector in the direction perpendicular to the first top surface is thinner than the thickness of the sixth connector in the direction perpendicular to the first top surface.

* * * * *